United States Patent [19]

Cutler et al.

[11] 4,291,303
[45] Sep. 22, 1981

[54] TOUCH PAD AND DISPLAY TUBE CIRCUITRY

[75] Inventors: Scott E. Cutler; Charles W. Eichelberger, both of Schenectady, N.Y.

[73] Assignee: General Electric Company, Schenectady, N.Y.

[21] Appl. No.: 68,753

[22] Filed: Aug. 23, 1979

[51] Int. Cl.³ .......................... G06F 3/14; G09F 9/32
[52] U.S. Cl. ............................... 340/711; 340/365 C; 340/802; 340/712
[58] Field of Search .............. 340/712, 711, 365 C, 340/365 R, 365 VL, 802

[56] References Cited

U.S. PATENT DOCUMENTS

| | | | |
|---|---|---|---|
| 3,971,013 | 7/1976 | Challoner et al. | 340/712 |
| 4,112,429 | 9/1978 | Tsuha et al. | 340/712 |
| 4,145,748 | 3/1979 | Eichelberger et al. | 340/365 C |

*Primary Examiner*—Marshall M. Curtis
*Attorney, Agent, or Firm*—Geoffrey H. Krauss; James C. Davis; Marvin Snyder

[57] ABSTRACT

Improved touch pad and display tube circuitry including a touch pad circuit, a tube circuit, and a scan voltage pulse drive circuit for generating scan voltage pulses applied to the touch pad and display tube circuits. The touch pad circuit receives scanning voltage pulses having very fast rise-times, to reduce the effects of contaminants which may be present on the surface of the touch pad panel. The display tubes of the display tube circuit each include an anode, a plurality of display cathodes and a control cathode. The current flowing through the control cathode is proportional to the current in the associated display cathodes. The control cathode current is utilized by the drive circuit to adjust to a desired value the value of the magnitude of the scan voltage pulses applied to the anodes of the display tubes. The drive circuit utilizes a substantial portion of common circuitry to generate both the touch pad and display tube scan voltage pulses. The control circuit also functions to isolate the touch pads and display tube anodes in such manner that the fast rise-time pulses applied to the touch pads are not coupled to the display tube anodes.

52 Claims, 27 Drawing Figures

TOUCH PAD AND DISPLAY TUBE CIRCUITRY

BACKGROUND OF THE INVENTION

The present invention relates to circuitry for use with capacitive touch pads, such as are widely used in control panels for microwave ranges and for other appliances and, more particularly, relates to circuitry for use with touch pads associated with displays using multiplexed gas discharge or vacuum display tubes.

In an appliance utilizing both capacitive touch pads and multiplexed display tubes, it is necessary to scan both the pads and tubes at frequent intervals. It is highly desirable, from the viewpoint of economy in size and cost, that as much of the scanning circuitry as possible be used in common with both the touch pads and the display tubes. If this is done, however, certain problems of interference between touch pad circuitry and tube circuitry may occur. For example, if an anode of a display tube receives, by pickup and the like, a touch pad scan voltage pulse, the pulse will be coupled via the tube to the touch detection circuitry associated with the touch pad panel, creating significant imbalance in the touch pad response.

A second problem, arising with the use of capacitive touch pads, is a result of the frequent presence of contaminants (e.g., food) on the surface of the touch pad panel. The presence on the panel of materials, e.g. water, with its high dielectric constant (about 80 times that of air), or good ionic conductors like dishwashing detergent or salt, can cause coupling between adjacent touch pads, and present difficulty in making a determination of which of the pads has actually been touched. The conventional solution to this problem is to provide a relatively large spacing between adjacent touch pads. This solution is undesirable from the viewpoint of spatial considerations, such as economy and ease of fabrication.

A third problem is attributable to the requirements that the magnitude of the touch pad scan pulse voltage must be substantially constant while the magnitude of the display tube scan pulse voltage is generally varying. Particularly, the voltage magnitude of the display tube scan pulse (applied to the anode of a gas discharge tube) which is required to produce a predetermined tube brightness varies from tube to tube and varies for any given tube with time and temperature. Accordingly, the control circuitry generating the display tube scan voltage pulses must be capable of varying the voltage magnitude of these pulses to meet the particular requirements of each tube. In contrast, the voltage magnitude of the drive pulses applied to the touch pads must be maintained at a substantially constant level if a meaningful interpretation of the touch pad responses is to be made.

An additional problem is that when a touch pad is touched, power-line frequency, e.g. 60 cycle, energy is sometimes picked up and coupled into the touch pad, making it difficult for the circuitry to determine whether or not the pad has been touched.

One further problem that can arise, if adjacent touch pads are too close together, is that more than one pad can be simultaneously touched by the finger of the operator of the device being controlled by the touch pads, resulting in a spurious detection of a "touch" condition. It is desirable to solve this problem without increasing the spacing between adjacent touch pads.

BRIEF DESCRIPTION OF THE INVENTION

As noted above, a major problem which arises in connection with capacitive touch pad systems is that contaminants on the surface of the touch pad may cause resistive or dielectrical coupling between adjacent touch pads. If the contaminant is water, adjacent touch pads are coupled by the very high dielectric constant of the water. In such a case, the molecules in the water are polarized and will align themselves with the applied E-field. Other contaminants, such as dishwashing or laundry detergent or salt water, cause resistive coupling between adjacent pads due to ionic conduction. In the former case, the effect of the dielectric coupling (on the touch pad response signals appearing at the output of the touch pads) is delayed due to the finite period of time required for the water molecules to align themselves. In the latter case, system capacitances associated with the touch pads cause a similar delay in the effect of the coupling resistance on the touch pad response signals. In either case, the magnitude of the touch pad response signal will initially be determined only by the presence or absence of a user's finger adjacent to the touch pad being scanned and will thereafter be reduced by an amount which varies as a function of the contaminant coupling between adjacent touch pads.

The present invention utilizes the foregoing characteristics of coupling contaminants to overcome the effect of such contaminants. Particularly, the present invention utilizes a driver circuit which generates touch pad scan voltage pulses having a sufficiently fast rise time that each of the touch pad response signals initially pulses to a value indicative of the capacitance-to-ground of the associated touch pad and thereafter changes its value due to ohmic and/or dielectric coupling between adjacent touch pads, if contaminants of a sufficient amount are located on the face plate. The present invention further utilizes a detecting circuit which detects the presence of a touch condition by examining only the intitial level of the touch pad response signals.

As further noted above, more than one touch pad can easily be touched if the touch pads are located too close together. In such a situation, the operator's finger will cover a substantial portion of the touch pad he intended to touch and only a small portion of the touch pad he did not intend to touch. As a result, the touch pad response signals associated with these two touch pads will indicate a strong and a weak touch, respectively. In an alternative embodiment of the present invention, these two touch conditions are distinguished by providing a detector circuit which sequentially examines the touch pad response signals at the outputs of each of the touch pads and generates a touch condition output signal indicating the presence of a touch condition whenever the initial value of the last-generated touch response signal has a magnitude which indicates that the capacitance-to-ground of its associated touch pad is at least equal to a predetermined value. The detector circuit further includes means for suppressing the generation of a touch condition signal responsive to the last-generated touch response signal whenever the initial value of the next-to-last-generated touch response signal indicates that the capacitance-to-ground of its associated touch pad is at least equal to the predetermined value, unless the initial value of the last-generated touch response signal has a magnitude which indicates that the capacitance-to-ground of its associated touch pad is greater than the predetermined value.

Finally, the driver circuit of the present invention generates both the touch pad and display tube drive voltage pulses and sequentially applies these pulses to the touch pads and display tubes. The driver circuitry is designed in such a manner that a substantial amount of common circuitry is utilized to generate both the touch pad and display tube scan pulse voltage. The driver circuit is capable of adjusting the voltage magnitude of each of the display tube scan pulses independently of the voltage magnitude of the touch pad scan pulses. The magnitude of the display tube scan pulse voltage is adjusted as a function of the current in a control cathode of the display tube to which the display tube scan pulse voltage is being applied to assure that the display tube will exhibit a predetermined luminescence. Finally, the anodes of the display tube and the inputs of the touch pads are ohmically isolated from each other to assure that the fast rise-time touch pad pulses are not coupled to the display tube anodes.

BRIEF DESCRIPTION OF THE DRAWINGS

For the purpose of illustrating the invention, there are shown in the drawings several embodiments which are presently preferred; it being understood, however, that this invention is not limited to the precise arrangements and instrumentalities shown.

FIGS. 4A-4R are a set of coordinated timing diagrams, illustrating the waveforms of various signals appearing in the circuits of FIGS. 1, 2, and 3;

FIGS. 6A-D are a set of coordinated timing diagrams, illustrating the waveforms of signals appearing at various locations in the circuit of FIG. 5.

DETAILED DESCRIPTION OF THE INVENTION

Figure 1:
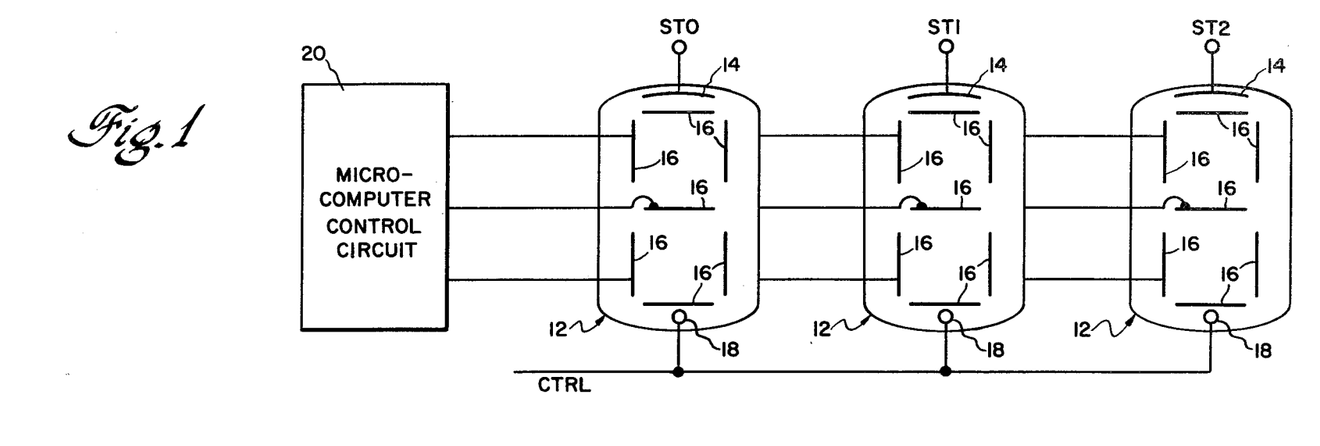
FIG. 1 is a schematic diagram of the display tube circuit of the present invention.

Referring now to the drawings, wherein like numerals indicate like elements, there is shown in FIG. 1 a display circuit 10 utilized in connection with the drive and scan circuitry of the present invention. Display circuit 10 includes a plurality of display tubes 12 which are preferably gas discharge tubes (although other types of display tubes may be equally as well used); each tube 12 includes an anode 14, a plurality of display cathodes 16 and a control cathode 18. In the exemplary embodiment, each of the cathodes 16 corresponds to a different one of the segments of a standard seven-segment display, although other display formats may, however, be used. Each similarly positioned cathode 16 in all of the plurality of tubes 12 are coupled, in electrical parallel connection, to an associated different one of the outputs of a microcomputer control circuit 20 (only three outputs are shown for simplicity) which determines which ones of the seven sets of cathodes 16 are to be grounded at any instant. Whenever a scan pulse voltage of a sufficient amplitude is applied to the anode 14 of a respective tube 12, those display cathodes 16 which are grounded by microcomputer control circuit 20 will glow, causing the display of an appropriate letter or number in the tube. As the cathode 16 will illuminate only when its respective anode 14 receives an appropriate one of scan pulse ST0, ST1 or ST2, the operation of each tube may be independently controlled utilizing standard multiplexing techniques.

The degree to which each cathode 16 is illuminated is a direct function of the current flowing therethrough. The current flowing through the cathode 16 is, in turn, controlled by the magnitude of the drive voltage applied to the anode 14 with which it is associated. This current is also affected by other parameters of the tube 12 which change with time, temperature and other tube variables. In order to insure that each cathode 16 will be illuminated to a predetermined constant luminosity, it is desirable to adjust the voltage magnitude of the scan pulses ST0, ST1 and ST2, applied to each of the tubes 12. To this end, each tube 12 includes a control cathode 18, preferably located at the bottom of the tube 12. The current applied to control cathode 18 is representative, to a first order, of the current flow to the cathodes 16 of the same tube. As such, the current in control cathode 18 may be utilized to adjust the magnitude of the scan pulse applied to the anodes 14 of the "turned-on" tube 12.

When a given tube 12 is "off", its anode 14 is maintained at a quiescent voltage which lies approximately midway between its "turn-on" voltage (that voltage required to cause current flow between the anode and the cathodes) and ground potential. When the tube is to be turned "on", a scan pulse having a voltage magnitude at least equal to its "turn-on" voltage is applied to its anode 14. Thereafter, the anode voltage should be adjusted to the particular value which will cause a predetermined current flow in the grounded cathodes 16 and therefore a predetermined degree of luminosity. Since the anode voltage required to induce a particular current in the cathodes 16 changes with time and temperature, the pulse supply circuit supplying voltage pulses to each anode 14 must be capable of independently adjusting the magnitude of the anode voltages as a function of the instantaneous current to the associated control cathode 18. Circuits for achieving this function are described and claimed in Application Ser. No. 068,752 filed on even date herewith, assigned to the assignee of the present application and incorporated herein by reference.

Figure 2:
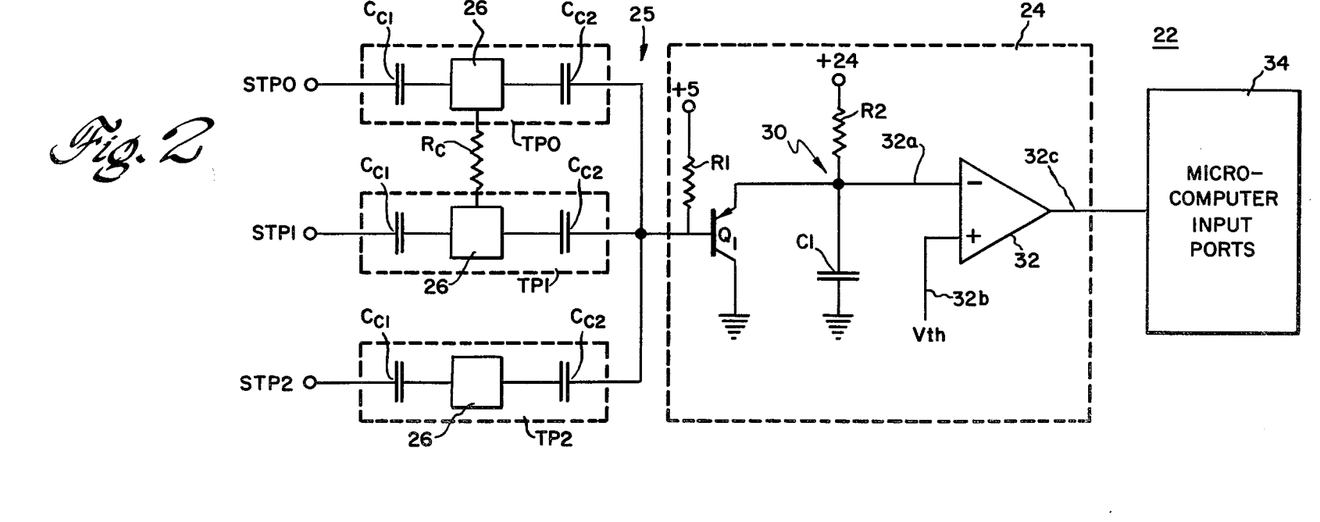
FIG. 2 is a circuit diagram of the touch pad circuit of the present invention, which circuit receives touch pad scan voltage pulses generated by the circuit of FIG. 3.

Referring now to FIG. 2, there is shown a touch pad circuit 22 comprising a plurality of individual touch pads, illustratively being three touch pads TP0-TP2, and a touch detecting circuit 24. While three touch pads are shown in the embodiment illustrated, a greater or lesser number of touch pads may be utilized as desired and properly multiplexed in accordance with well-known techniques. Each of the touch pads TP0-TP2 comprises a flat plate 26 which defines a common electrode of a pair of coupling capacitors $C_{c1}$ and $C_{c2}$. The flat plate 26 is normally covered by an insulative material, such as a glass plate, which may be touched by an operator of the circuit 22. When the glass plate is touched, plate 26 is capacitively coupled to ground by the operator's finger such that the capacitance-to-ground of the touch pad changes. Such a change in capacitance affects the percentage of an associated scan signal voltage (either STP0, STP1 or STP2) applied to the detecting circuit 24. Assuming that touch pad TP0 has been touched, this change in capacitance reduces the percentage of the scan pulse voltage STP0, applied to the input of touch pad TP0, to reach the base of a transistor Q1. This change in the magnitude of the signal applied to the base of the transistor Q1 is utilized by detecting circuit 24 to determine whether touch pad TP0 has been touched. In a similar manner, the change in the capacitance to ground of the remaining touch pads TP1 or TP2 is detected by detecting circuit 24 during respective scanning time periods associated with each of the touch pads.

A major problem which arises in connection with capacitive touch pad systems of the foregoing type is that contaminants on the surface of the touch pad panel (the glass insulator) may couple signals between adjacent touch pads. This problem occurs when one of two adjacent touchpads (e.g., TP0) is touched and the remaining touch pad (e.g., TP1) is coupled to the first pad by contaminants on the surface of the touch pad panel. This coupling is illustrated schematically by the phantom resistor $R_C$ in FIG. 2. If the contaminant is water, adjacent touch pads are coupled by the very high dielectric constant of water. In such case, the molecules in the water are polarized and will align themselves with the applied E-field. Other contaminants, such as dishwashing or laundry detergent or salt water, cause resistive coupling between adjacent pads due to ionic conduction. In the former case, the effect of the dielectric coupling on the touch pad response signal applied to the base of transistor Q1 is delayed due to the finite period of time required for the water molecules to align themselves. In the latter case, system capacitances (e.g. $C_{c1}$ and $C_{c2}$) associated with the coupling resistance $R_C$ cause a similar delay in the effect of the coupling resistance on the touch pad response applied to the base of transistor Q1. In either case, the magnitude of the touch pad response signal applied to the base of transistor Q1 will initially be determined only by the presence or absence of a user's finger adjacent to the touch pad being scanned and will thereafter be reduced by an amount which varies as a function of the contaminant coupling $R_C$ between adjacent touch pads.

The present invention utilizes the foregoing characteristics of the coupling contaminants to ensure that detecting circuit 24 is immune from the effects of the coupling contaminants. Particularly, detecting circuit 24 includes a sample and hold circuit which samples the magnitude of the touch pad response signal applied to the base of transistor Q1 before the magnitude of that signal is changed as a result of the coupling contaminants.

Detecting circuit 24 comprises a filter circuit 25 including resistor R1 and the coupling capacitors $C_{c1}$, $C_{c2}$ and a sample and hold circuit including transistor Q1, resistor R2 and capacitor C1. The filter circuit serves the dual functions of filtering out any 60 cycle noise in the circuit and differentiating the input pulses STP0-STP2. This relationship may better be understood with reference to FIGS. 4L-4P. FIGS. 4L-4N represent the waveforms of the scan pulses STP0-STP2, respectively. The manner in which these waveforms are generated will be described below with reference to FIG. 3. In each case, the actual scanning pulse is represented by the short negative pulse designated by numeral 28 in FIG. 4N. The important feature of the scanning pulses 28 is that they have a fast rise-time. As used herein the term rise-time refers to the time it takes the leading edge of the pulse to transfer from its initial to its final value.

Each of the three scan pulses STP0-STP2 is sequentially applied to the associated one of touch pads TP0-TP2 and each pulse voltage is attenuated by approximately 20 percent if the particular associated touch pad is touched. The attempted signal is then differentiated by the filter defined by the coupling capacitors and the resistor R1, resulting in the waveform illustrated in FIG. 4P. This waveform is applied to the base of transistor Q1 which acts as an emitter follower, applying the same waveform as an input to the RC circuit R2-C1. The time constant of this circuit is relatively slow and results in the waveform illustrated in FIG. 4Q. As shown therein, the voltage across capacitor C1 initially drops by an amount equal to the drop at the base of the transistor Q1 and thereafter rises at a rate determined by the time constant of the RC circuit R2-C1 until it reaches its quiescent level. Since the time constant of the input filter at the base of transistor Q1 is faster than the time constants associated with the coupling contaminants, the output of the RC circuit 30 (R2-C1) is not affected by these contaminants.

The output of RC circuit 30 is applied to the inverting input 32a of a comparator 32, the non-inverting input 32b of which receives a threshold potential Vth. The threshold potential Vth is chosen to lie above the magnitude of the voltage across capacitor C1 for a non-touch condition and below the voltage thereof for a touch condition. As a result, the comparator output 32c pulses high only when a touch occurs at the touch pad associated with the scan pulse STP0, STP1 or STP2 last applied to touch pad circuit 22. The output 32c pulse is applied to the microcomputer input port 34 which samples the comparator output 32c at predetermined intervals corresponding to the intervals at which the scan pulses STP0-STP2 are applied to circuit 22.

Figure 3:
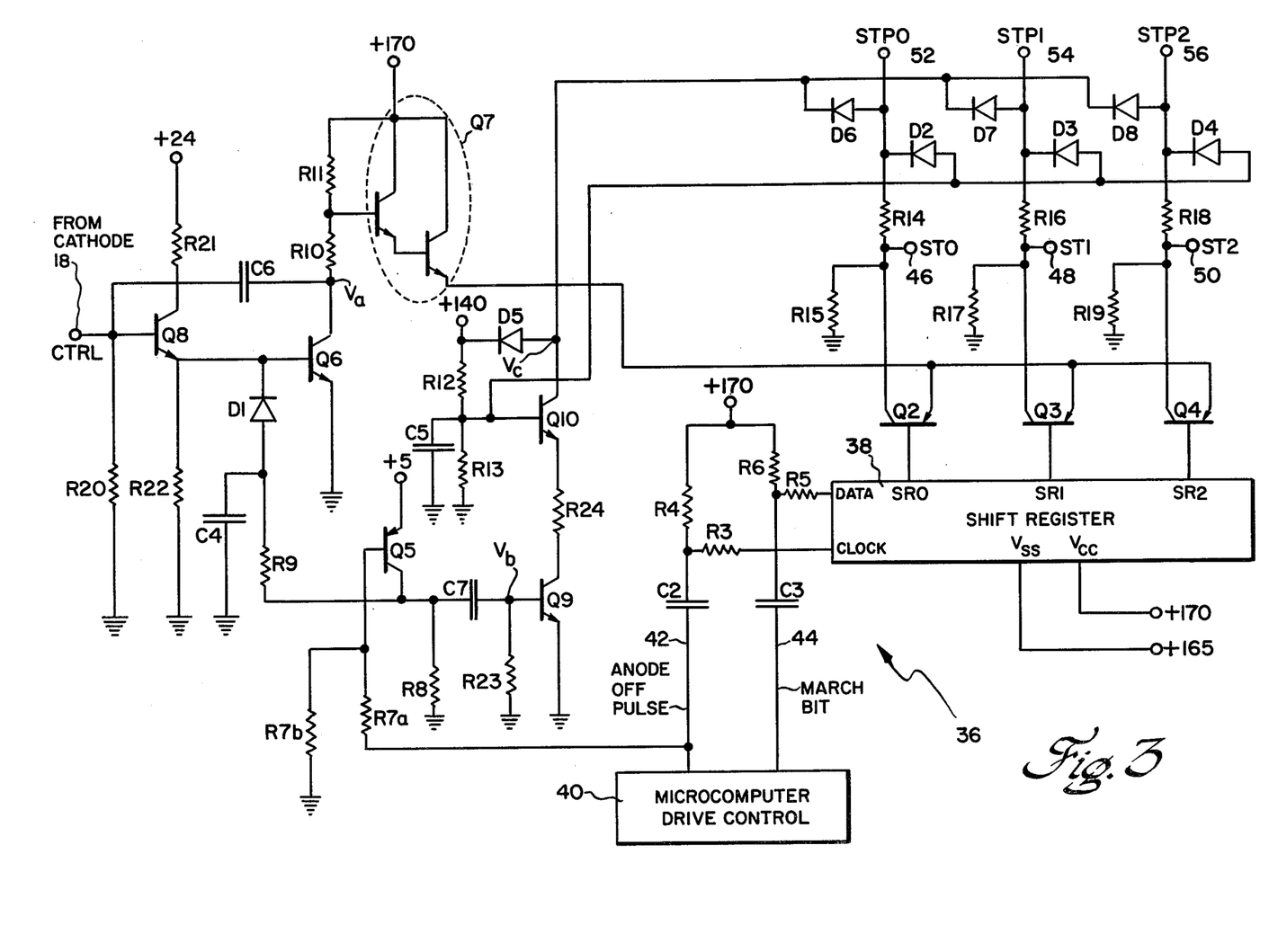
FIG. 3 is a schematic diagram of the driver circuit of the present invention, which driver circuit generates the display tube and touch pad scan voltage driving pulses.
Figure 4:
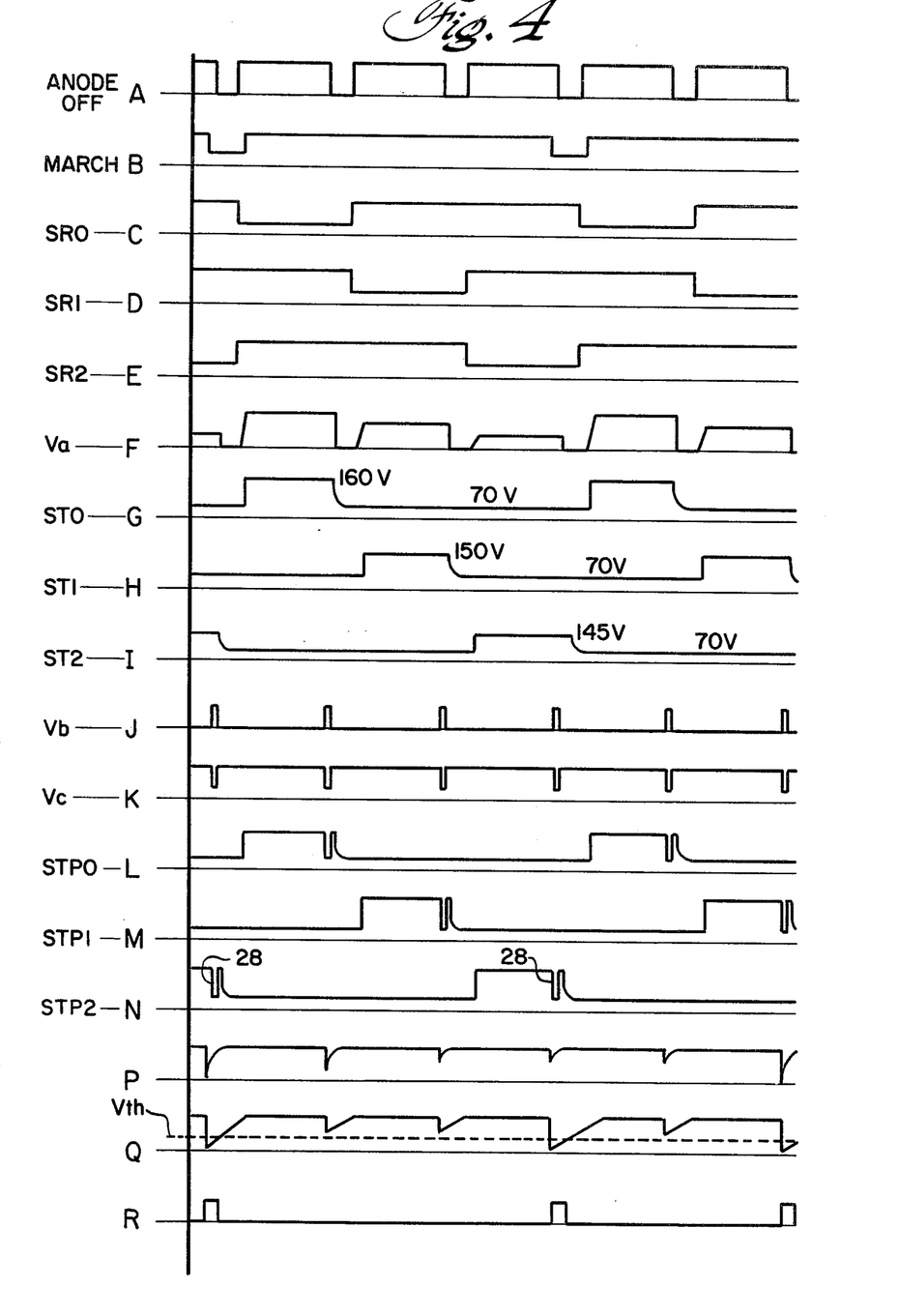

Referring now to FIG. 3, there is shown a scan pulse driver circuit 36 which generates both the display tube scan voltages pulses ST0-ST2 (hereinafter referred to generally as scan pulses ST) and the touch pad scan voltages pulses STP0-STP2 (hereinafter referred to generally as scan pulses STP). As will be shown below, circuit 36 has three primary features:

(1) It permits the duration and magnitude of the display tube scan pulses ST to be controlled independently from the magnitude and duration of the touch pad scan pulses STP;

(2) It utilizes a substantial amount of common circuitry for generating both the display tube scan pulses ST and the touch pad scan pulses STP; and (3) It ohmically isolates the touch pads of the touch pad circuit 22 from the anodes of the display tubes 12 in order that the fast rise time touch pad scan pulses STP do not affect the magnitude of the quiescent voltage applied to the anodes of the display tubes 12.

As noted above, each of the display tubes 12 and each of the touch pads TP0-TP2 (hereinafter referred to generally as touch pads TP) are scanned in a time multiplexed manner. Circuitry for scanning only the display tube is described in the aforementioned co-pending application Ser. No. 068,752. To scan both display tubes and touch pads with common circuitry, however, scan pulse driver circuit 36 must include means for applying a display tube or a touch pad scan pulse to a different one of the display tubes 12 and the touch pads TP, respectively, in each of a plurality of successive time intervals. This goal is achieved utilizing a shift register 38 and a plurality of transistors Q2-Q4. In the embodiment illustrated, a three-to-one multiplexing rate is assumed, although higher or lower multiplexing rates may be employed as desired.

The operation of shift register 38 is controlled by a microcomputer drive control 40 which generates anode "off" pulses on line 42 and "march" bits on line 44. As shown in FIGS. 4A and 4B, microcomputer drive control 40 generates one "march" bit (a negative-going pulse) for each set of three anode "off" pulses (which are also negative-going pulses). Generally, the ratio of anode "off" pulses to "march" bits will be equal to the multiplexing ratio of shift register 38. Each anode "off" bit is applied to the clock input of shift register 38 via resistor R3 and capacitor C2. The clock input of shift register 38 is normally biased to a positive potential (generally a binary "1") by the positive biasing voltage (+170 volts) applied to resistor R4. As such, shift register 38 will clock in the information contained on its data input each time a new anode "off" pulse is generated by microcomputer drive control 40. As will become apparent below, the frequency of the anode "off" pulses determines the scanning frequency of the touch pad-display system. While any desired scanning rate may be used, it is preferred that the anode "off" pulses be generated at a rate of at least 60 Hz to avoid "flicker" in the display tubes 12.

The "march" bits generated by microcomputer drive control 40 are applied to the data input of shift register 38 via resistor R5 and capacitor C3. The data input of shift register 38 is normally biased to a positive potential by the +170 volts applied to resistor R6. As shown in FIGS. 4A and B, the width of each "march" bit is somewhat longer than the width of each anode "off" to ensure that shift register 38 reads a binary "0" at its data input each time a "march" bit is generated. As a result of the foregoing, a binary "0" will be shifted through the outputs SR0-SR2 of shift register 38 at a frequency determined by the frequency of the anode "off" pulses. As a result of the biasing potentials Vcc and Vss used in the embodiment illustrated, a binary "1" at the output of shift register 38 is represented by 170 volts while a binary "0" at its output is represented by 165 volts. These voltages are shown merely by way of example and any other appropriate voltages could be utilized if suitable changes are made with respect to the remaining biasing voltages shown.

The outputs SR0, SR1 and SR2 of shift register 38 are coupled to the base of transistor Q2, Q3 and Q4, respectively. As will be shown below, the emitters of these transistors periodically receive a voltage of approximately 170 volts. As such, only that transistor whose base receives a binary "0" (i.e., 165 volts) will be on. As the binary "0" bit is shifted through the outputs of shift register 38, transistors Q2, Q3 and Q4 will sequentially be turned on. As seen in FIG. 3, transistors Q2, Q3 and Q4 are associated with the 0 (i.e., STP0 and ST0), 1 (i.e. STP1 and ST1) and 2 (i.e., STP2 and ST2) scan pulses, respectively. As will become clear below, each time a given transistor Q2-Q4 is turned on, it enables the generation of its associated scan pulses STP and ST. For example, the scan pulses STP0 and ST0 may be generated during the period that transistor Q2 is on. In the embodiment illustrated, the touch pad scan pulses STP are generated during the interval in which the anode "off" pulses are generated (when line 42 is at a binary "0" level) and the display tube scan pulses ST are generated during the interval in between the generation of successive anode "off" pulses (i.e., when line 42 is at a binary "1" level). The manner in which these pulses are generated will now be described.

Each anode "off" pulse applied to line 42 is also applied to the base of transistor Q5 via a voltage divider R7a and R7b, chosen to ensure that transistor Q5 will be biased in the on condition whenever line 42 is at the binary "0" level and will be biased in the off condition at all other times. As a result, a positive-going pulse train having the same frequency as the frequency of the anode "off" pulses will appear across resistor R8.

The pulse train appearing across resistor R8 is applied to the base of transistor Q6 via diode D1 after a time delay determined by resistor R9 and capacitor C4. These positive going pulses periodically drive transistor Q6 into saturation, thereby grounding its collector.

The collector of transistor Q6 is coupled to the base of the Darlington transistor Q7 via resistor R10. The collector of transistor Q7 is biased at 170 volts and is coupled to its base via resistor R11. So connected, transistor Q7 operates as a voltage follower wherein its emitter follows the voltage applied to its base. Whenever transistor Q6 is turned on by the positive pulses applied to its base, current flows through resistor R10, thereby reducing the voltage at the base of transistor Q7. The value of resistors R10 and R11 are chosen such that the base of transistor Q7 falls to a value which causes its emitter to drop from 170 to 160 volts whenever transistor Q6 is driven into saturation. Since the emitter of transistor Q7 is coupled to the emitter of each of the PNP transistors Q2-Q4, each of the PNP transistors will be biased off (the outputs of shift register 38 will be at either 165 or 170 volts) when transistor Q6 is driven into saturation by the positive pulses applied to its base. In this condition, display tube anode input terminals 46, 48 and 50 will be biased to the quiescent voltage (e.g. 60 volts) of the anodes 14 of display tubes 12. The source of this biasing voltage is the voltage divider R12-R13 coupled to the anode of diodes D2-D4, respectively. Resistor R13 is shunted by a high frequency filter capacitor C5 which ensures that a constant voltage (e.g., 70 volts) is induced across resistor R13 by the 140 volt power source. The particular value of the quiescent voltage for each of the tubes 12 is determined by the voltage dividers R14-R15, R16-R17 and R18-R19, respectively.

When the positive pulse is removed from the base of transistor Q6, the voltage at the base of transistor Q7 is permitted to rise towards 170 volts in accordance with a ramp function determined by an integrator comprising transistors Q6 and Q8 and a capacitor C6. Before the tube 12 associated with transistor Q2 is turned on, the voltage Va, and therefore the voltage at the base of transistor Q7, is permitted to rise at a rate determined by the circuit defined by resistors R10, R11 and R20 and capacitor C6. Once the voltage at the emitter of transistor Q7 has increased to approximately 0.7 volts above the Vss biasing voltage (165 volts), transistor Q2 will turn on and will act as a current source supplying current to resistors R14 and R15 and to the tube 12 receiving the scan pulse ST0. Once current begins flowing through the control cathode 18 of tube 12, it will be applied to resistor R20 creating a voltage potential at the base of transistor Q8. The collector of transistor Q8 is biased at 24 volts via resistor R21. Its emitter is coupled to ground via resistor R22 and to the base of transistor Q6. As the voltage across resistor R20 increases, transistor Q8 will be driven into conduction thereby increasing the voltage at the base of transistor Q6 and tending to turn transistor Q6 on. Transistors Q6 and Q8 cooperate with capacitor C6 to adjust the voltage Va, and therefore the voltage at the emitter of transistor Q7, to a level which causes the voltage at input terminal 46 to rise to a level which causes the current in control cathode 18 to reach a preset value determined by the magnitude of resistor R20.

As best seen in FIG. 4F, the voltage Va increases to a value which is determined by the parameters of the particular tube 12 which is being accessed by the most recently generated scan pulse ST. For example, if the tube receiving scan pulse STO is being accessed, the voltage VA will increase to a level which will cause transistor Q2 to supply sufficient current to resistors R14 and R15 to assure that the control cathode of tube 12 will receive the predetermined amount of current. Since the anode voltage ST required to achieve this result is different for each tube 12, the magnitude of each of the scan pulses ST are independently adjusted to a level which will produce the predetermined control cathode current for its associated tube. See FIGS. 4G–4I.

The positive pulse train appearing across resistor R8 is also applied to the base of transistor Q9 via a differentiator formed by capacitor C7 and resistor R23. Since the differentiator has a fast time constant, the signal voltage Vb applied to the base of transistor Q9 comprises a series of fast rise-time pulses having a frequency equal to the frequency of the anode "off" pulses. See FIG. 4J. Particularly, one such pulse is generated coincident with the leading edge of each anode "off" pulse. Since the emitter of transistor Q9 is grounded, each pulse of the signal Vb drives transistor Q9 into saturation.

Transistor Q9 is coupled to transistor Q10 via resistor R24. When transistor Q9 is off, transistor Q10 is also off and its collector voltage Vc is clamped to 140 volts via diode D5. When transistor Q9 pulses on, it grounds the emitter of transistor Q10 and turns transistor Q10 on. When transistor Q10 is turned on, it forms a common-base configuration causing its collector voltage Vc to pulse down to the 70 volt potential appearing at its base. As soon as transistor Q9 turns off, transistor Q10 will also turn off and its collector voltage Vc will return to the 140 volt level. As a result, a negative-going pulse train having a frequency equal to the frequency of the anode "off" pulses appears at the collector of transistor Q10. See FIG. 4K.

The collector of transistor Q10 is coupled to the touch pad inputs 52, 54 and 56 (coupled to touch pads TP0, TP1 and TP2, respectively) via diodes D6, D7 and D8, respectively. As long as the transistor (e.g., Q2) associated with a given touch pad input (e.g., 52) is off, that input (52) will be clamped to the 70 volt level by its associated diode (e.g., D2). When the transistor (e.g., Q2) associated with a given input (e.g., 52) is turned on, the voltage appearing at the collector of the transistor tends to raise the voltage of the input (e.g., 52) towards the level of the associated discharge tube input (e.g., 46). This is so because the turn on voltage of the tubes 12 will always be above 140 volts. In this condition, the output (e.g., 52) associated with the transistor (e.g., Q2) which is turned on will be clamped to the 140 volt level by its associated diode (e.g., D6). The output will stay at this level until transistor Q9 is pulsed on causing the negative-going pulse to appear at the collector of transistor Q10. This negative pulse will be applied to the input in question (e.g., 52) via its associated diode (e.g., D6). The resultant waveforms are illustrated in FIGS. 4L–4N.

The anodes 14 of tubes 12 are relatively large and could be capacitively coupled to the touch pads TP0–TP2 if the fast rise-time pulse appearing at inputs 52–56 were coupled back to inputs 46–50. Accordingly, each of the inputs 52, 54 and 56 are isolated from inputs 46, 48 and 50 by resistors R14, R6 and R18, respectively. As a result, inputs 52, 54 and 56 are permitted to pulse negatively without affecting the voltage level at inputs 46, 48 and 50. A further advantage of the circuit of FIG. 3 is that if there is significant capacitive coupling between the various touch pads, the diode clamping of diodes D2–D4 will prevent a non-accessed input (e.g. 54 and 56) from changing voltage due to the fast rise-time pulse applied to the accessed input (e.g., 52). That is, since the non-accessed inputs (e.g. 54 or 56) are clamped to the 70 volt level by their respective diodes (e.g., D3, D4) the voltage level at these inputs will not be affected by the negative pulse falling from 140 to 70 volts on the accessed input (e.g., 52).

Figure 5:
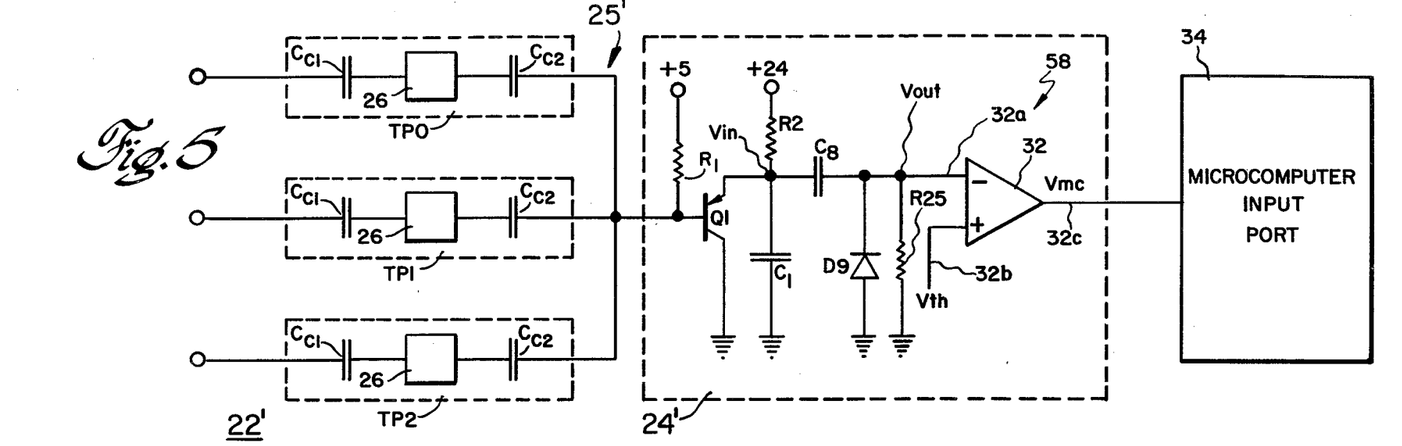
FIG. 5 is a schematic diagram of a second embodiment of the touch pad circuit of the present invention.

Referring now to FIG. 5, there is shown an alternative embodiment of touch pad circuit 22 which is designated generally as 22'. While the touch pads TP0–TP2 of circuit 22' are identical to those of circuit 22, an alternative detecting circuit 24' is substituted for the circuit 24 of FIG. 3. This circuit should be utilized whenever it is desirable to more positively distinguish between the touch and no-touch conditions.

In a typical touch pad arrangement, the individual touch pads TP will be spaced relatively close to one another. For this reason, it is quite possible to touch two touch pads simultaneously. In such a situation, a substantial portion of the touch pad which the user intends to touch will be covered by the user's finger and a strong touch condition will be detected by detector circuit 24'. Since only a relatively small portion of the adjacent touch pad will be covered by the operator's finger, detecting circuit 24' will detect a relatively weak touch in connection with this touch pad. If it is assumed that scan pulses are successively applied to the adjacent touch pads and that the touch pad which the operator intends to touch is touched first, then it can be seen that detector circuit 24' first receives a strong touch signal followed by a weak touch signal. Circuit 24' is designed to distinguish between these touch conditions by interpreting a relatively weak touch response which follows the detection of a strong touch response as a no-touch condition. To this end, detecting circuit 24' includes a capacitor C8 which functions as a memory element which remembers when a touch condition was detected responsive to the generation of the last touch pad scan pulse STP. When such a signal is detected, capacitor C8 modifies the operation of detecting circuit 24' in such a manner that a relatively strong touch response must be detected responsive to the generation of the next scan pulse STP in order for detecting circuit 24' to interpret that latter touch response as indicating a touch condition.

Figure 6:
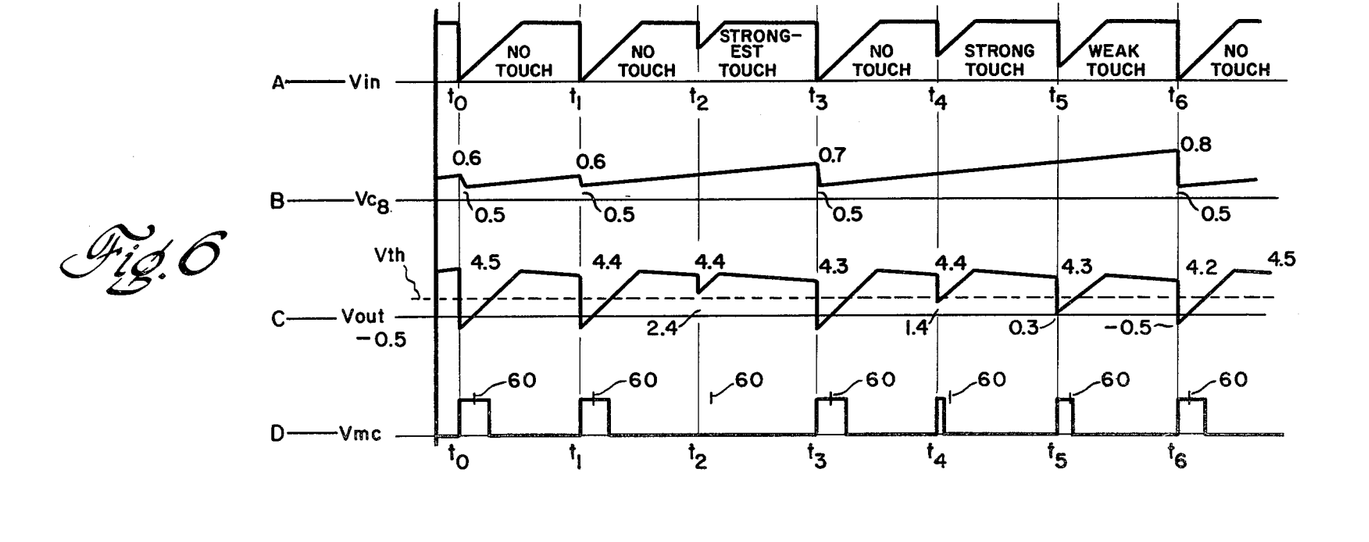

As in the circuit of FIG. 2, detecting circuit 24' includes a filter circuit 25' comprising resistor R1 and the capacitances associated with touch pads TP, and a sample-and-hold circuit defined by transistor Q1, resistor R2 and capacitor C1. As a result, a voltage Vin, having the waveform illustrated in FIG. 6A, appears across capacitor C1. In the embodiment illustrated, it is assumed that the parameters of resistor R1 and the capacitance of the non-accessed touch pads (which serve to shunt the output of the accessed touch pad) are chosen to cause the base of transistor Q1 to pulse between +5 volts and 0 volts responsive to a scan pulse STP which is applied to a touch plate which is not touched. Such parameters will result in the signal Vin illustrated in FIG. 6A. It is further assumed that during the time period encompassing times $t_0$, $t_1$ and $t_2$, touch pad TP2 is touched and the remaining touch pads are not touched. It is further assumed that scan pulses STP0, STP1 and STP2 are applied to their respective touch pads (TP0, TP1, TP2) at time $t_0$, $t_1$ and $t_2$, respectively. As a result, the signal Vin pulses negatively from 5 to 0 volts at times $t_0$, $t_1$ and $t_2$ and pulses negatively from 5 volts to approximately 3 volts at time $t_2$. This relatively shallow pulse (at time $t_2$) represents a very strong touch.

During the time interval encompassing times $t_3$, $t_4$ and $t_5$, it is assumed that touch pad TP1 is touched but that the operator's finger partially overlaps touch pad TP2. It is further assumed that scan signals STP0, STP1 and STP2 are applied to their respective touch pads at instants $t_3$, $t_4$ and $t_5$, respectively. As such, the voltage Vin pulses from 5 to 0 volts at time $t_3$ (representing no-touch), from 5 to approximately 3 volts DC at time $t_4$ (representing a strong touch) and from 5 to approximately 4 volts at time $t_5$ (representing a weak touch). In the manner described below, the touch distinguishing portion 58 of circuit 24' serves to emphasize the distinction between the strong and weak touch responses at times $t_4$ and $t_5$.

As shown in FIG. 5, the touch distinguishing portion 58 of circuit 24' includes the capacitor C8, a diode D9 and a resistor R25. Capacitor C8 is discharged to 0.5 volts at a relatively fast rate through diode D9 whenever the voltage Vin pulses downwardly by a sufficient amount to forward bias diode D9. This will occur whenever a no-touch signal appears across capacitor C1. Capacitor C8 is charged at a relatively slow rate via resistor R25 at all other times. The manner in which capacitor C8 serves to emphasize the difference between a strong touch and a weak touch condition can best be understood with reference to FIG. 6.

The time interval during which only touch pad TP2 is touched will be analyzed first. It will be assumed that the voltage across capacitor C8 is less than 0.5 volts prior to time $t_0$. At time $t_0$, voltage Vin pulses down to 0 volts driving the anode of diode D9 towards −0.5 volts since the voltage across capacitor C9 cannot change instantaneously. Once the voltage at diode D9 reaches −0.5 volts (assuming that the forward biased drop across diode D9 is 0.5 volts), diode D9 becomes forward biased and the voltage across capacitor C8 quickly falls to 0.5 volts at a rate determined by the time constant defined by capacitor C8 and the negligible resistance of the forward biased diode D9. Thereafter capacitor C8 charges through resistor R25 at a relatively slow rate determined by the time constant of capacitor C8 and resistor R25. The discharging of capacitor C8 will continue until time t1. During this interval, the voltage Vout across resistor R25 increases along with the input voltage Vin from −0.5 volts to somewhat less than 4.5 volts (due to the charging of capacitor C8). Thereafter, the output voltage Vout continues to decay to approximately 4.4 volts. It should be noted at this time that the instantaneous value of the output voltage Vout will be equal to the instantaneous value of the input voltage Vin less the voltage across capacitor C9.

At time $t_1$, the input voltage Vin pulses negatively 5 volts to 0 volts causing a similar voltage drop in the output voltage Vout. The output voltage is again clamped to −0.5 volts by diode D9 and capacitor C9 is again charged to 0.5 volts. The operation of pulse-distinguishing portion 58 during the time interval between times $t_1$ and $t_2$ is substantially identical to the time interval between times $t_0$ and $t_1$ as shown in FIGS. 6A–6C. At time $t_2$, input voltage Vin pulses negatively from 5 to 3 volts indicating an extremely strong touching of touch pad TP2. Since the voltage drop across capacitor C1 is only −2 volts, the output voltage Vout drops to 2.4 volts and diode D9 is not forward biased. As such, capacitor C8 is not discharged but continues to charge through resistor R25. The charging of capacitor C8 continues until time t3 resulting in an increase of the voltage across the capacitor to 0.7 volts and a reduction of the output voltage Vout to 4.3 volts.

As noted above, it is assumed that during the time interval encompassing times $t_3$, $t_4$ and $t_5$, a substantial portion of touch pad TP1 is covered by the operator's finger while only a small portion of touch pad TP2 is covered by the operator's finger. As a result, the operation of touch-distinguishing portion 58 of circuit 24' is as follows: At time $t_3$, the input voltage Vin pulses negatively to 0 volts thereby driving the output voltage Vout to −0.5 volts and forward biasing diode D9. In this condition, diode D9 quickly discharges capacitor C8 to 0.5 volts and effectively erases the stored information on capacitor C8 which had indicated a strong touch during the last scanning instant $t_2$. During the time interval between times $t_3$ and $t_4$, capacitor C8 charges through resistor R25 and output voltage Vout decreases to 4.4 volts in the manner illustrated. At time $t_4$, the input voltage Vin pulses negatively from 5 to 2 volts, indicating a relatively strong touching of touch pad TP1. Since the voltage Vin was reduced only to 3 volts, the output voltage is reduced to only 1.4 volts and diode D9 remains reversed biased. As such, capacitor C8 continues to discharge and the voltage Vout continues to drop as shown in FIGS. 6B and 6C. The increased voltage across capacitor C9 (i.e., 0.6 volts) indicates a touch condition at scan instant $t_4$.

At time $t_5$, the input voltage Vin pulses negatively from 5 volts to 1 volt, indicating a relatively weak touch. However, since the voltage Vout had reduced to 4.2 volts due to the continued charging of capacitor C9, the voltage Vout now reduces to 0.3 volts, thereby looking more like a no-touch condition than would be the case if circuit 24' did not contain capacitor C8. As a result, this signal is interpreted as a no-touch condition. See below. Finally, at time $t_6$, input voltage Vin pulses negatively from 5 to 0 volts, forward biasing diode D9, discharging capacitor C8 and thereby erasing the stored information on capacitor C8.

The output signal Vout appearing across resistor R25 is applied to the inverting input terminal 32a of comparator 32. The non-inverting input terminal 32b of comparator 32 receives a threshold voltage Vth which defines the threshold level for the recognition of a touch condition. As shown in FIG. 6D, the output Vmc of comparator 32 pulses high whenever the output voltage Vout falls below the threshold voltage Vth. The duration of each of these pulses is inversely proportional to the strength of each touch signal. Thus, a no-touch condition results in an output pulse Vmc having a relatively wide pulse width, whereas a strong touch results in either no output pulse or an output pulse having a relatively narrow pulse width. The effect of capacitor C8 is to increase the pulse width of any touch signal following a strong touch signal, thereby making such a signal look more like a no-touch condition and more positively distinguishing between touch and no-touch conditions.

By sampling the output signal Vmc at each of a plurality of sampling instants 60 (each sampling instant follows a scanning instant $t_0, t_1 \ldots$ by a predetermined length of time), it is possible to unambiguously detect the presence or absence of a touch on any given touch pad TP. With particular reference of FIG. 6D, microcomputer input port 34 will detect a binary "1" each time it samples output Vmc following a no-touch condition and will detect a binary "0" each time it samples output Vmc following a strong touch condition.

Although several preferred embodiments of this invention have been described, many variations and modifications will now be apparent to those skilled in the art, and it is therefore preferred that the instant invention be limited not by the specific disclosure herein but only by the appended claims.

What is claimed is:

1. A touch pad circuit comprising:
   first and second touch pads each having an input and an output, and having a common face plate which permits contaminants located on said face plate to form ohmic and/or dielectric couplings between said touch pads;
   scan pulse generator means for applying touch pad scan pulses to said inputs of said touch pads to cause first and second touch response signals to appear at the outputs of said first and second touch pads, respectively; said touch pad scan pulses having a sufficiently fast rise-time that said first and second touch response signals initially pulse to an initial level determined by the capacitance to ground of said first and second touch pads, respectively, and thereafter change their value due to ohmic and/or capacitive coupling between said first and second touch pads caused by contaminants on said common face plate if contaminants of a sufficient amount are located on said face plate; and
   detector circuit means coupled to said touch pads for determining which, if any, of said touch pads is being touched by an operator of said touch pad circuit by examining said initial level of said touch pad response signals.

2. The touch pad circuit of claim 1, wherein said detector circuit means comprises a sample and hold circuit which samples the magnitude of said initial level of said touch response signals and is not affected by changes in the value of said first and second touch response signals due to ohmic or resistive coupling between said touch pads caused by contaminants on said face plate.

3. The touch pad circuit of claim 2, wherein said sample and hold circuit includes an RC circuit having a long time constant compared to the rise-time of said touch pad scan pulses.

4. The touch pad circuit of claim 3, wherein said detector circuit means further includes comparator means for generating output pulses whose pulse width varies as a function of the time the voltage across the capacitive element of said RC circuit is below a predetermined threshold value.

5. The touch pad circuit of claim 4, wherein said detector circuit means further includes a filter for filtering out power-line-frequency signals coupled to said touch pads.

6. The touch pad circuit of claim 5, wherein said first and second touch pads include a flat plate and coupling capacitors coupling said flat plate to said touch plate input and output and wherein said coupling capacitors form part of said filter.

7. The touch pad circuit of claim 5, wherein said detector circuit further includes a transistor which operates as an emitter follower, the output of said filter being applied to the base of said transistor, the signal at the emitter of said transistor being applied to said RC circuit and said comparator.

8. The touch pad circuit of claim 3, wherein said detector circuit means further includes a filter for filtering out power-line-frequency signals coupled to said touch pads.

9. The touch pad circuit of claim 8, wherein said first and second touch pads include a flat plate and coupling capacitors coupling said flat plate to said touch plate input and output and wherein said coupling capacitors form part of said filter.

10. The touch pad circuit of claim 8, wherein said detector circuit further includes a transistor which operates as an emitter follower, the output of said filter being applied to the base of said transistor, the signal at the emitter of said transistor being applied to said RC circuit and said comparator.

11. The touch pad circuit of claim 2, wherein said detector circuit means further includes a filter for filtering out 60 Hz signals coupled to said touch pads.

12. The touch pad circuit of claim 11, wherein said first and second touch pads include a flat plate and coupling capacitors coupling said flat plate to said touch plate input and output and wherein said coupling capacitors form part of said filter.

13. The touch pad circuit of claim 11, wherein said detector circuit further includes a transistor which operates as an emitter follower, the output of said filter being applied to the base of said transistor, the signal at the emitter of said transistor being applied to said RC circuit and said comparator.

14. The touch pad circuit of claim 1, wherein said scan pulse generator means applies said touch pad scan pulses to said first and second touch pads sequentially such that said first and second touch response signals appear at said first and second touch pad outputs sequentially.

15. The touch pad circuit of claim 14, wherein said first and second touch pad outputs are coupled together and wherein said detector circuit means comprises a sample and hold circuit which receives said first and second touch response signals sequentially.

16. The touch pad circuit of claim 15, wherein said detector circuit means comprises a sample and hold circuit which samples the magnitude of said initial level of said touch response signals and is not affected by changes in the value of said first and second touch response signals due to ohmic or resistive coupling between said touch pads caused by contaminants on said face plate.

17. The touch pad circuit of claim 16, wherein said sample and hold circuit includes an RC circuit having a long time constant compared to the rise-time of said touch pad scan pulses.

18. The touch pad circuit of claim 17, wherein said detector circuit means further includes comparator means for generating output pulses whose pulse width varies as a function of the time the voltage across the capacitive element of said RC circuit is below a predetermined threshold value.

19. A touch pad circuit, comprising:
a plurality of touch pads, each of said touch pads including an input and an output and having a common face plate which permits contaminants on said face plate to ohmically and/or dielectrically couple adjacent touch pads;
scan pulse generating means for sequentially applying touch pad scan pulses to said inputs of each of said plurality of touch pads to cause touch pad response signals to sequentially appear at the outputs of each of said touch pads, each of said touch pad response signals being associated with the touch pad at whose output said touch response signal appears, said touch pad scan pulses having a sufficiently fast rise-time that each of said response signals initially pulses to a value indicative of the capacitance to ground of its associated touch pad and thereafter changes its value due to ohmic and/or dielectric coupling between adjacent touch pads if contaminants of a sufficient amount are located on said face plate; and
detector circuit means for sequentially examining said touch response signals and for generating a touch condition output signal indicating the presence of a touch condition whenever said initial value of the last generated touch response signal has a magnitude which indicates that the capacitance to ground of its associated touch pad is at least equal to a predetermined value, said detector circuit means including means for suppressing the generating of a touch condition signal responsive to said last generated touch response signal whenever said initial value of the next-to-last generated touch response signal indicates that the capacitance to ground of its associated touch pad is at least equal to said predetermined value unless said initial value of said last generated touch response signal has a magnitude which indicates that the capacitance to ground of its associated touch pad is greater than said predetermined value.

20. The touch pad circuit of claim 19, wherein said suppressing means includes a capacitor, the charge across which is indicative of whether or not said next-to-last generated touch response signal indicated that the capacitance to ground of its associated touch pad was at least equal to said predetermined value.

21. The touch pad circuit of claim 20, wherein said suppressing means further includes means for discharging said capacitor to a predetermined value when said detecting circuit generates a touch condition output signal and for charging said capacitor at all other times.

22. The touch pad circuit of claim 21, wherein said detecting circuit means includes a sample and hold circuit which samples said initial value of said touch response signals.

23. The touch pad circuit of claim 22, wherein said sample and hold circuit comprises an RC circuit.

24. The touch pad circuit of claim 23, wherein said touch pad circuit includes a filter for filtering out 60 Hz signals coupled to said touch pads.

25. The touch pad circuit of claim 24, wherein said touch condition output signal comprises the absence of a pulse having at least a predetermined pulse width at predetermined time intervals.

26. The touch pad circuit of claim 22, wherein said touch condition output signal comprises the absence of a pulse having at least a predetermined pulse width at predetermined time intervals.

27. The touch pad circuit of claim 20, wherein said detecting circuit means includes a sample and hold circuit which samples said initial value of said touch response signals.

28. The touch pad circuit of claim 27, wherein said sample and hold circuit comprises an RC circuit.

29. The touch pad circuit of claim 28, wherein said touch pad circuit includes a filter for filtering out 60 Hz signals coupled to said touch pads.

30. The touch pad circuit of claim 29, wherein said touch condition output signal comprises the absence of a pulse having at least a predetermined pulse width at predetermined time intervals.

31. The touch pad circuit of claim 27, wherein said touch condition output signal comprises the absence of a pulse having at least a predetermined pulse width at predetermined time intervals.

32. The touch pad circuit of claim 19, wherein said detecting circuit means includes a sample and hold circuit which samples said initial value of said touch response signals.

33. The touch pad circuit of claim 32, wherein said sample and hold circuit comprises an RC circuit.

34. The touch pad circuit of claim 33, wherein said touch pad circuit includes a filter for filtering out 60 Hz signals coupled to said touch pads.

35. The touch pad circuit of claim 34, wherein said touch condition output signal comprises the absence of a pulse having at least a predetermined pulse width at predetermined time intervals.

36. The touch pad circuit of claim 32, wherein said touch condition output signal comprises the absence of a pulse having at least a predetermined pulse width at predetermined time intervals.

37. A touch pad and display circuit, comprising:
a plurality of display tubes, each of said display tubes adapted to display a desired indicia only when a display scan pulse is applied thereto;
a plurality of touch pads, each of said touch pads having an input and an output;
detector means for determining which, if any, of said touch pads is being touched by an operator of said touch pad and display circuit by examining response signals appearing at said touch pad outputs responsive to the application of touch pad scan signals to said touch pad inputs; and
driver circuit means for sequentially applying touch pad scan pulses to said touch pad inputs and for sequentially applying display tube scan signals to said display tubes.

38. The touch pad and display circuit of claim 37, wherein said driver circuit means comprises:
touch pad scan pulse generating means for generating one touch pad scan pulse during each of a plurality of scan intervals;
display tube scan pulse generating means for generating one display tube scan pulse during each of said plurality of scan intervals; and
pulse distributing means for applying each said touch pad scan pulse and each said display tube scan pulse to only one of said touch pads and display tubes, respectively, during any given said scan interval.

39. A touch pad and display circuit, comprising:

a plurality of display tubes, each of said display tubes adapted to display a desired indicia when a display scan pulses is applied thereto;

a plurality of touch pads, each of said touch pads having an input and an output, said touch pads sharing a common face plate which permits contaminants on said face plate to ohmically and/or dielectrically couple adjacent touch pads;

detector means for determining which, if any, of said touch pads is being touched by an operator of said touch pad display circuit by examining response signals appearing at said touch pad outputs responsive to the application of touch pad scan signals to said touch pad inputs; and driver circuit means for sequentially applying touch pad scan pulses to said touch pad inputs and for sequentially applying display tube scan signals to said display tubes;

each of said touch pad response signals examined by said detector means being associated with the touch pad at whose output said touch pad response signal appears, said touch pad scan pulses having a sufficiently fast rise-time that each of said response signals initially pulses to a value indicative of the capacitance to ground of its associated touch pad and thereafter changes its value due to ohmic and/or dielectric coupling between adjacent touch pads if contaminants of a sufficient amount are located on said face plate.

40. The circuit of claim 39, wherein said driver circuit means can adjust the magnitude of said display tube scan pulses independently of the magnitude of said touch pad scan pulses.

41. The circuit of claim 40, wherein each of said display tubes include a control cathode and wherein said display tube scan pulse generating means adjusts the magnitude of each of said display tube scan pulses as a function of the current in the control cathode of the display tube to which said display tube scan pulse is being applied.

42. The circuit of claim 41, wherein each of said display tubes includes an anode to which said display tube scan pulses are applied and wherein said display tube scan pulses are applied and wherein said driver circuit means ohmically isolates said touch pad inputs from said display tube anodes.

43. The circuit of claim 42, wherein each of said touch pad inputs is coupled to an associated one of said display tube anodes by a circuit element having a resistive component.

44. The circuit of claim 38, wherein said touch pad scan pulse generating means and said display tube scan pulse generating means share common circuit elements.

45. The circuit of claim 38, wherein said driver circuit means includes means for adjusting the magnitude of said display tube scan pulses independently of the magnitude of said touch pad scan pulses.

46. The circuit of claim 45, wherein each of said display tubes include a control cathode and wherein said adjusting means includes means for adjusting the magnitude of each of said display tube scan pulses as a function of the current in the control cathode of the display tube to which said display tube scan pulse is being applied.

47. The circuit of claim 46, wherein each of said display tubes includes an anode to which said display tube scan pulses are applied and wherein said driver circuit means ohmically isolates said touch pad inputs from said display tube anodes.

48. The circuit of claim 47, wherein each of said touch pad inputs is coupled to an associated one of said display tube anodes by a circuit element having a resistive component.

49. The circuit of claim 37, wherein said driver circuit means includes means for adjusting the magnitude of said display tube scan pulses independently of the magnitude of said touch pad scan pulses.

50. The circuit of claim 49, wherein each of said display tubes include a control cathode and wherein said adjusting means includes means for adjusting the magnitude of each of said display tube scan pulses as a function of the current in the control cathode of the display tube to which said display tube scan pulse is being applied.

51. The circuit of claim 50, wherein each of said display tubes includes an anode to which said display tube scan pulses are applied and wherein said driver circuit means ohmically isolates said touch pad inputs from said display tube anodes.

52. The circuit of claim 51, wherein each of said touch pad inputs is coupled to an associated one of said display tube anodes by a circuit element having a resistive component.

* * * * *